(12) United States Patent
Zhu (10) Patent No.: US 12,098,978 B2
(45) Date of Patent: Sep. 24, 2024

(54) METHOD AND SYSTEM FOR MEASURING MOTOR DAMPING

(71) Applicant: Honor Device Co., Ltd., Shenzhen (CN)

(72) Inventor: Jianwei Zhu, Shenzhen (CN)

(73) Assignee: HONOR DEVICE CO., LTD., Shenzhen (CN)

(*) Notice: Subject to any disclaimer, the term of this patent is extended or adjusted under 35 U.S.C. 154(b) by 0 days.

(21) Appl. No.: 17/799,382

(22) PCT Filed: Jan. 21, 2022

(86) PCT No.: PCT/CN2022/073171
§ 371 (c)(1),
(2) Date: Aug. 12, 2022

(87) PCT Pub. No.: WO2022/247324
PCT Pub. Date: Dec. 1, 2022

(65) Prior Publication Data
US 2024/0183754 A1    Jun. 6, 2024

(30) Foreign Application Priority Data

May 24, 2021  (CN) .................. 202110566568.X
Jun. 15, 2021  (CN) .................. 202110661936.9

(51) Int. Cl.
*G01M 99/00*    (2011.01)

(52) U.S. Cl.
CPC .................. *G01M 99/005* (2013.01)

(58) Field of Classification Search
None
See application file for complete search history.

(56) References Cited

U.S. PATENT DOCUMENTS

| | | |
|---|---|---|
| 5,262,708 A | 11/1993 | Metzger et al. |
| 7,529,459 B1 | 5/2009 | Wang et al. |
| 11,175,739 B2 | 11/2021 | Lacroix et al. |
| 2004/0135535 A1 | 7/2004 | Kunzel et al. |
| 2016/0239089 A1 | 8/2016 | Taninaka et al. |
| 2020/0150767 A1 | 5/2020 | Karimi Eskandary et al. |
| 2022/0416706 A1 | 12/2022 | Zha et al. |

FOREIGN PATENT DOCUMENTS

| | | |
|---|---|---|
| CN | 101097247 A | 1/2008 |
| CN | 105587475 A | 5/2016 |
| CN | 107014480 A | 8/2017 |
| CN | 109269745 A | 1/2019 |

(Continued)

*Primary Examiner* — Daniel S Larkin
(74) *Attorney, Agent, or Firm* — Conley Rose, P.C.

(57) ABSTRACT

Embodiments of this application provide a method and system for measuring motor damping. In the method for measuring motor damping, a driving signal is generated to drive a to-be-tested motor to operate, and at a cut-off moment of the driving signal, the to-be-tested motor enters a free damping state and a turn-off signal is generated at this moment to cut off a test circuit of the to-be-tested motor. In this way, an acceleration of the to-be-tested motor having the test circuit cut off and in the free damping state can be acquired, and damping of the to-be-tested motor is obtained by using the acceleration of the to-be-tested motor having the test circuit cut off and in the free damping state, thereby realizing the measurement of the damping of the to-be-tested motor.

20 Claims, 7 Drawing Sheets

(56) References Cited

FOREIGN PATENT DOCUMENTS

| | | |
|---|---|---|
| CN | 110146810 A | 8/2019 |
| CN | 110259700 A | 9/2019 |
| CN | 110912338 A | 3/2020 |
| CN | 111323614 A | 6/2020 |
| CN | 111551847 A | 8/2020 |
| CN | 111552371 A | 8/2020 |
| CN | 111965537 A | 11/2020 |
| CN | 112326240 A | 2/2021 |
| CN | 112532145 A | 3/2021 |
| EP | 3518078 A2 | 7/2019 |
| EP | 3650993 A1 | 5/2020 |
| KR | 20120124899 A | 11/2012 |
| RU | 2659762 C1 | 7/2018 |

METHOD AND SYSTEM FOR MEASURING MOTOR DAMPING

CROSS-REFERENCE TO RELATED APPLICATIONS

This application is a U.S. National Stage of International Application No. PCT/CN2022/073171 filed on Jan. 21, 2022, which claims priority to Chinese Patent Application No. 202110566568.X, filed with the China National Intellectual Property Administration on May 24, 2021 and Chinese Patent Application No. 202110661936.9, filed with the China National Intellectual Property Administration on Jun. 15, 2021, all of which are incorporated herein by reference in their entireties.

TECHNICAL FIELD

This application relates to the technical field of data processing, and in particular, to a method and system for measuring motor damping.

BACKGROUND

The basic parameters of linear motors, such as mechanical damping, are to be used for building models of the linear motor. Therefore, a solution by which the mechanical damping of linear motors can be measured is required.

SUMMARY

This application provides a method, apparatus, and system for measuring motor damping, so as to realize the measurement of mechanical damping of a linear motor.

To achieve the foregoing objective, this application provides the following technical solutions.

In a first aspect, this application provides a method for measuring motor damping, applicable to a processor. The method includes: generating a driving signal to drive a to-be-tested motor to operate, where at a cut-off moment of the driving signal, the to-be-tested motor is in a free damping state, and at this moment, generating a turn-off signal to cut off a test circuit of the to-be-tested motor; and acquiring an acceleration of the to-be-tested motor having the test circuit cut off and in the free damping state, and obtaining mechanical damping of the to-be-tested motor by using the acceleration of the to-be-tested motor having the test circuit cut off and in the free damping state.

In the method for measuring motor damping provided in this aspect, the driving signal drives the to-be-tested motor to operate. The to-be-tested motor is in the free damping state at the cut-off moment of the driving signal. By using the turn-off signal to cut off the test circuit of the to-be-tested motor, electromagnetic damping of the to-be-tested motor during operation may be removed. Therefore, the damping of the to-be-tested motor obtained by using the acceleration of the to-be-tested motor having the test circuit cut off and in the free damping state is the mechanical damping of the to-be-tested motor.

In a possible implementation, a manner in which a turn-off signal may be generated at the cut-off moment of the driving signal to drive the switch to be turned off to cut off the test circuit of the to-be-tested motor may be adopted, so as to generate the turn-off signal at the cut-off moment of the driving signal to cut off the test circuit of the to-be-tested motor. Certainly, the switch is connected to the test circuit of the to-be-tested motor.

In a possible implementation, the acquiring an acceleration of the to-be-tested motor having the test circuit cut off and in the free damping state may include: acquiring a target acceleration of the to-be-tested motor having the test circuit cut off and in the free damping state, where the target acceleration is obtained by signal conditioning of the acceleration of the to-be-tested motor having the test circuit cut off and in the free damping state.

In a second aspect, this application provides another method for measuring motor damping, applicable to a processor. The method includes: generating a driving signal to drive a to-be-tested motor, where at a cut-off moment of the driving signal, the to-be-tested motor is in a free damping state, acquiring an acceleration of the to-be-tested motor in the free damping state, and obtaining total damping of the to-be-tested motor by using the acceleration of the to-be-tested motor in the free damping state.

In the method for measuring motor damping provided in this aspect, the driving signal drives the to-be-tested motor to operate, the to-be-tested motor is in the free damping state at the cut-off moment of the driving signal, and the total damping of the to-be-tested motor may be calculated by using the acceleration of the to-be-tested motor in the free damping state.

In a possible implementation, the acquiring an acceleration of the to-be-tested motor in the free damping state may include: acquiring a target acceleration of the to-be-tested motor in the free damping state, where the target acceleration is obtained by signal conditioning of the acceleration of the to-be-tested motor in the free damping state.

In a third aspect, this application provides an apparatus for measuring motor damping, including two generation units, an acquisition unit, and a calculation unit. A first generation unit in the two generation units is configured to generate a driving signal to drive a to-be-tested motor to operate, and a second generation unit is configured to generate a turn-off signal to cut off a test circuit of the to-be-tested motor at a cut-off moment of the driving signal; The acquisition unit is configured to acquire an acceleration of the to-be-tested motor having the test circuit cut off and in a free damping state. The calculation unit is configured to obtain damping of the to-be-tested motor by using the acceleration of the to-be-tested motor having the test circuit cut off and in the free damping state.

In the apparatus for measuring motor damping provided in this aspect, the driving signal generated by the first generation unit drives the to-be-tested motor to operate, and the to-be-tested motor is in the free damping state at the cut-off moment of the driving signal. Electromagnetic damping of the to-be-tested motor during operation may be eliminated by using the turn-off signal generated by the second generation unit to cut off the test circuit of the to-be-tested motor. Therefore, the calculation unit may calculate the damping of the to-be-tested motor by using the acceleration of the to-be-tested motor having the test circuit cut off and in the free damping state and that is acquired by the acquisition unit. The damping of the to-be-tested motor is mechanical damping of the to-be-tested motor.

In a possible implementation, during generation of the turn-off signal at the cut-off moment of the driving signal to cut off the test circuit of the to-be-tested motor, the second generation unit is configured to generate the turn-off signal at the cut-off moment of the driving signal, to drive a switch to be turned off to cut off the test circuit of the to-be-tested motor, where the switch is connected to the test circuit of the to-be-tested motor.

In a possible implementation, during acquisition of the acceleration of the to-be-tested motor having the test circuit cut off and in the free damping state, the acquisition unit is configured to acquire a target acceleration of the to-be-tested motor having the test circuit cut off and in the free damping state, where the target acceleration is obtained by signal conditioning of the acceleration of the to-be-tested motor having the test circuit cut off and in the free damping state.

In a fourth aspect, this application provides another apparatus for measuring motor damping, including a generation unit, an acquisition unit, and a calculation unit. The generation unit is configured to generate a driving signal to drive a to-be-tested motor to operate. The acquisition unit is configured to acquire an acceleration of the to-be-tested motor in a free damping state. The calculation unit is configured to obtain total damping of the to-be-tested motor by using the acceleration of the to-be-tested motor in the free damping state.

In the apparatus for measuring motor damping provided in this aspect, the driving signal generated by the generation unit drives the to-be-tested motor to operate, and the to-be-tested motor is in the free damping state at the cut-off moment of the driving signal. The calculation unit may obtain damping of the to-be-tested motor by using the acceleration of the to-be-tested motor in the free damping state that is acquired by the acquisition unit. The damping of the to-be-tested motor is total damping of the to-be-tested motor.

In a possible implementation, the acquiring an acceleration of the to-be-tested motor in the free damping state may include: acquiring a target acceleration of the to-be-tested motor in the free damping state, where the target acceleration is obtained by signal conditioning of the acceleration of the to-be-tested motor in the free damping state.

In a fifth aspect, this application provides an electronic device, including: one or more processors and a memory configured to store a program, where when one or more processors execute the program in the memory, the method for measuring motor damping is performed in the first aspect or any one of the possible implementations of the first aspect.

In a sixth aspect, this application provides a system for measuring motor damping, including: a processor, a test fixture configured for a to-be-tested motor to be mounted, an accelerometer connected to the processor, and a switch arranged on a branch connecting the processor to the to-be-tested motor. The accelerometer is configured to detect the to-be-tested motor to obtain an acceleration of the to-be-tested motor. The processor is configured to perform the method for measuring motor damping in the first aspect or any one of the possible implementations of the first aspect.

In the system for measuring motor damping provided in this application, the driving signal drives the to-be-tested motor to operate. The to-be-tested motor is in the free damping state at the cut-off moment of the driving signal. By using the generated turn-off signal to cut off the test circuit of the to-be-tested motor, electromagnetic damping of the to-be-tested motor during operation may be removed. Therefore, the processor may calculate the damping of the to-be-tested motor by using the acceleration of the to-be-tested motor having the test circuit cut off and in the free damping state and that is detected by the accelerometer. The damping of the to-be-tested motor is the mechanical damping of the to-be-tested motor.

In a possible implementation, a sampling resistor and a power amplifier are further arranged on a branch connecting the processor to the to-be-tested motor.

In a possible implementation, a signal conditioner is further connected to the accelerometer. The signal conditioner is configured to perform signal conditioning on the acceleration outputted by the accelerometer and provide the acceleration after the signal conditioning to the processor.

In a possible implementation, the switch is an optronics relay.

In a possible implementation, a motor mounting area matching a structure of the to-be-tested motor is arranged inside the test fixture.

DESCRIPTION OF EMBODIMENTS

In the specification, claims, and accompanying drawings of this application, the terms "first", "second", "third", and the like are intended to distinguish between different objects but do not indicate a particular order.

In this application, the term "include". "comprise", or any other variant is intended to cover non-exclusive include, so that a process, a method, an article, or a device that includes a series of elements and that not only includes such elements, but also includes other elements not explicitly listed, or may further include elements inherent in the process, the method, the article, or the device. Unless otherwise specified, an element limited by "include a/an . . . " does not exclude other same elements existing in the process, the method, the article, or the device that includes the element.

Figure 1:
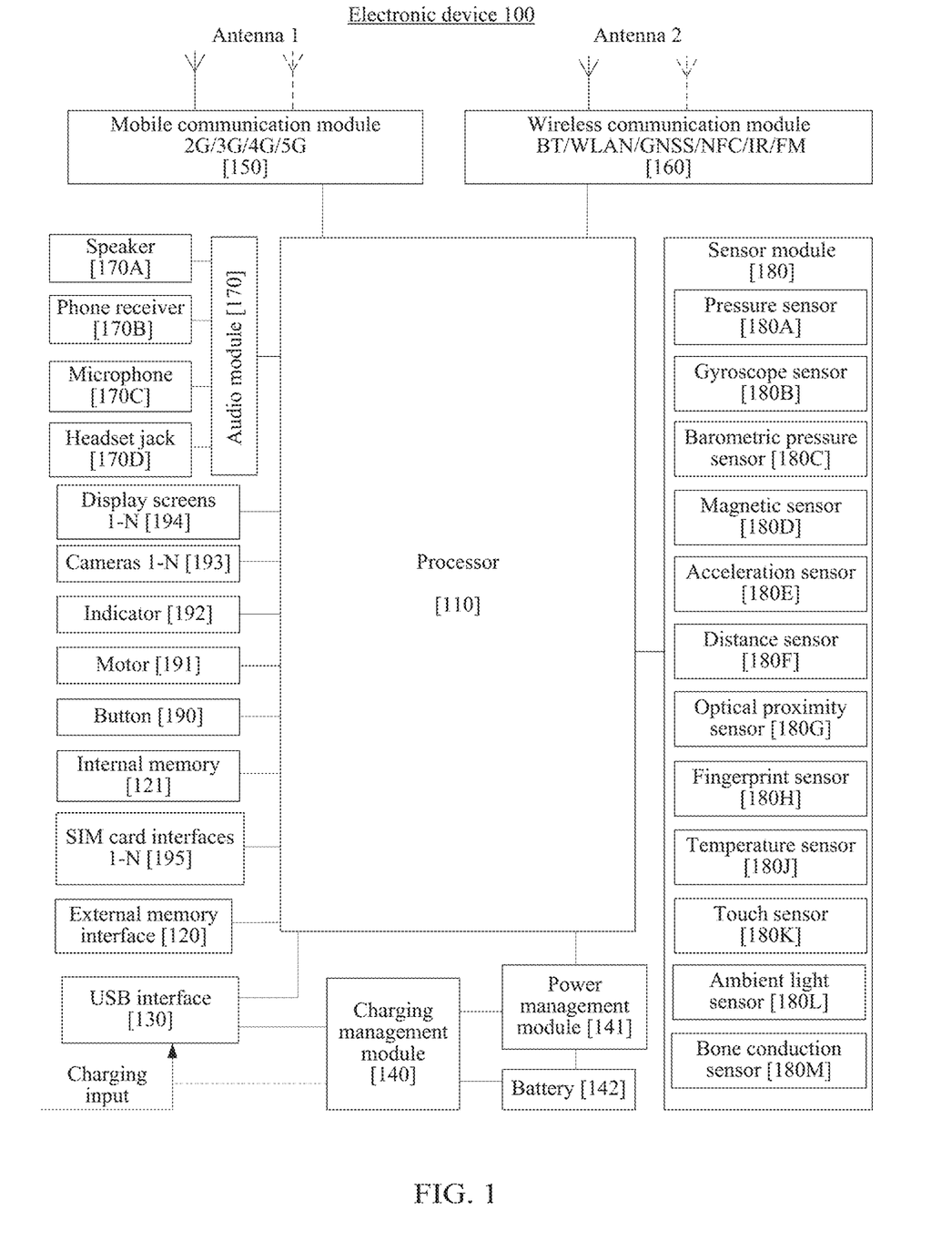
FIG. 1 is a schematic structural diagram of an electronic device according to an embodiment of this application.

FIG. 1 shows a schematic structural diagram of an electronic device 100.

The electronic device 100 may include a processor 110, an external memory interface 120, an internal memory 121, a universal serial bus (universal serial bus, USB) interface 130, a charging management module 140, a power management unit 141, a battery 142, an antenna 1, an antenna 2, a mobile communication module 150, a wireless communication module 160, an audio module 170, a speaker 170A, a phone receiver 170B, a microphone 170C, a headset jack 170D, a sensor module 180, a key 190, a motor 191, an indicator 192, a camera 193, a display screen 194, a subscriber identity module (subscriber identification module, SIM) card interface 195, and the like. The sensor module 180 may include a pressure sensor 180A, a gyroscope sensor 180B, a barometric pressure sensor 180C, a magnetic sensor 180D, an acceleration sensor 180E, a distance sensor 180F, an optical proximity sensor 180G, a fingerprint sensor 180H, a temperature sensor 180J, and a touch sensor 180K, an ambient light sensor 180L, a bone conduction sensor 180M, and the like.

It may be understood that an example structure in this embodiment of the present invention does not constitute a specific limitation on the electronic device 100. In some other embodiments of this application, the electronic device 100 may include more or fewer components than those shown in the figure, or some components may be combined, or some components may be divided, or different component arrangements may be used. The components in the figure may be implemented by hardware, software, or a combination of software and hardware.

The processor 110 may include one or more processing units. For example, the processor 110 may include an application processor (application processor, AP), a modem processor, a graphics processing unit (graphics processing unit, GPU), an image signal processor (image signal processor, ISP), a controller, a video codec, a digital signal processor (digital signal processor, DSP), a baseband processor, and/or a neural-network processing unit (neural-network processing unit, NPU). Different processing units may be independent devices, or may be integrated into one or more processors.

The processor may generate an operating control signal according to an instruction operation code and a sequence signal, to complete control of fetching and executing an instruction.

A memory may be further disposed in the processor 110, and is configured to store instructions and data. In some embodiments, the memory in the processor 110 is a cache memory. The memory may store an instruction or data that is recently used or cyclically used by the processor 110. If the processor 110 needs to use the instruction or the data again, the processor may directly invoke the instruction or the data from the memory, to avoid repeated access and reduce a waiting time of the processor 110, thereby improving system efficiency.

In some embodiments, the processor 110 may include one or more interfaces. The interface may include an inter-integrated circuit (inter-integrated circuit, I2C) interface, an inter-integrated circuit sound (inter-integrated circuit sound, I2S) interface, a pulse code modulation (pulse code modulation, PCM) interface, a universal asynchronous receiver/transmitter (universal asynchronous receiver/transmitter, UART) interface, a mobile industry processor interface (mobile industry processor interface, MIPI), a general-purpose input/output (general-purpose input/output, GPIO) interface, a subscriber identity module (subscriber identity module. SIM) interface, and/or a universal serial bus (universal serial bus, USB) interface, and the like.

The I2C interface is a two-way synchronization serial bus, and includes a serial data line (serial data line, SDA) and a serial clock line (derail clock line, SCL). In some embodiments, the processor 110 may include a plurality of groups of I2C buses. The processor 110 may be coupled to the touch sensor 180K, a charger, a flash light, the camera 193, and the like by using different I2C bus interfaces. For example, the processor 110 may be coupled to the touch sensor 180K by using the I2C interface, so that the processor 110 communicates with the touch sensor 180K by using the I2C bus interface, to implement a touch function of the electronic device 100.

The I2S interface may be used for audio communication. In some embodiments, the processor 110 may include a plurality of groups of I2S buses. The processor 110 may be coupled to the audio module 170 by using the I2S bus, to implement communication between the processor 110 and the audio module 170. In some embodiments, the audio module 170 may transfer an audio signal to the wireless communication module 160 by using the I2S interface, to implement a function of answering a call by using a Bluetooth headset.

The PCM interface may also be used for audio communication, and sampling, quantization, and encoding of an analog signal. In some embodiments, the audio module 170 may be coupled to the wireless communication module 160 by using the PCM bus interface. In some embodiments, the audio module 170 may alternatively transfer an audio signal to the wireless communication module 160 by using the PCM interface, to implement the function of answering a call by using a Bluetooth headset. Both the I2S interface and the PCM interface may be used for audio communication.

The UART interface is a universal serial data bus, and is used for asynchronous communication. The bus may be a two-way communication bus. The bus converts to-be-transmitted data between serial communication and parallel communication. In some embodiments, the UART interface is usually configured to connect the processor 110 to the wireless communication module 160. For example, the processor 110 communicates with a Bluetooth module in the wireless communication module 160 by using a UART interface, to implement a Bluetooth function. In some embodiments, the audio module 170 may transfer an audio signal to the wireless communication module 160 by using a UART interface, to implement a function of playing music by using a Bluetooth headset.

The MIPI interface may be configured to connect the processor 110 to a peripheral device such as the display screen 194 and the camera 193. The MIPI interface includes a camera serial interface (camera serial interface, CSI), a display serial interface (display serial interface, DSI), and the like. In some embodiments, the processor 110 communicates with the camera 193 by using the CSI interface, to implement a photographing function of the electronic device 100. The processor 110 communicates with the display screen 194 by using a DSI interface, to implement a display function of the electronic device 100.

The GPIO interface may be configured by using software. The GPIO interface may be configured to transmit a control signal, or may be configured to transmit a data signal. In some embodiments, the GPIO interface may be configured to connect the processor 110 to the camera 193, the display screen 194, the wireless communication module 160, the audio module 170, the sensor module 180, and the like. The GPIO interface may alternatively be configured as an I2C interface, an I2S interface, a UART interface, a MIPI interface, or the like.

The USB interface 130 is an interface that conforms to a USB standard specification, and may be specifically a mini USB interface, a micro USB interface, a USB Type C interface, or the like. The USB interface 130 may be configured to connect to the charger to charge the electronic device 100, or may be used for data transmission between the electronic device 100 and a peripheral device, or may be configured to connect to a headset, to play audio by using the headset. The interface may alternatively be configured to connect to another electronic device such as an AR device.

It may be understood that an interface connection relationship between the modules illustrated in this embodiment of the present invention is merely an example for description, and does not constitute a limitation on a structure of the electronic device 100. In some other embodiments of this application, the electronic device 100 may alternatively use an interface connection manner different from that in the foregoing embodiment, or use a combination of a plurality of the interface connection manners.

The charging management module 140 is configured to receive charging input from a charger. The charger may be a wireless charger or a wired charger. In some embodiments of wired charging, the charging management module 140 may receive a charging input of a wired charger by using the USB interface 130. In some embodiments of wireless charging, the charging management module 140 may receive a wireless charging input by using a wireless charging coil of the electronic device 100. The charging management module 140 may supply power to the electronic device by using the power management module 141 while charging the battery 142.

The power management module 141 is configured to connect to the battery 142, the charging management module 140, and the processor 110. The power management module 141 receives an input of the battery 142 and/or the charging management module 140, to supply power to the processor 110, the internal memory 121, the display screen 194, the camera 193, the wireless communication module 160, and the like. The power management module 141 may be further configured to monitor parameters such as a battery capacity, a battery cycle count, and a battery state of health (electric leakage and impedance). In some other embodiments, the power management module 141 may be alternatively disposed in the processor 110. In some other embodiments, the power management module 141 and the charging management module 140 may further be configured in the same device.

A wireless communication function of the electronic device 100 may be implemented by using the antenna 1, the antenna 2, the mobile communication module 150, the wireless communication module 160, the modem processor, the baseband processor, and the like.

The antenna 1 and the antenna 2 are configured to transmit or receive an electromagnetic wave signal. Each antenna in the electronic device 100 may be configured to cover one or more communication frequency bands. Different antennas may also be multiplexed to improve utilization of the antennas. For example, an antenna 1 may be multiplexed as a diversity antenna of a wireless local area network. In some other embodiments, the antenna may be used in combination with a tuning switch.

The mobile communication module 150 may provide a solution to wireless communication such as 2G/3G/4G/5G applied to the electronic device 100. The mobile communication module 150 may include at least one filter, a switch, a power amplifier, a low noise amplifier (low noise amplifier, LNA), and the like. The mobile communication module 150 may receive an electromagnetic wave through the antenna 1, perform processing such as filtering and amplification on the received electromagnetic wave, and transmit a processed electromagnetic wave to the modem processor for demodulation. The mobile communication module 150 may further amplify a signal modulated by the modem processor, and convert the signal into an electromagnetic wave for radiation through the antenna 1. In some embodiments, at least some function modules of the mobile communication module 150 may be disposed in the processor 110. In some embodiments, at least some functional modules of the mobile communication module 150 may be configured in a same device as at least some modules of the processor 110.

The modem processor may include a modulator and a demodulator. The modulator is configured to modulate a to-be-sent low-frequency baseband signal into a medium-high-frequency signal. The demodulator is configured to demodulate a received electromagnetic wave signal into a low-frequency baseband signal. Next, the demodulator transmits the demodulated low-frequency baseband signal to the baseband processor for processing. The low-frequency baseband signal is processed by the baseband processor and then transmitted to an AP. The AP outputs a sound signal through an audio device (which is not limited to the speaker 170A, the phone receiver 170B, and the like), or displays an image or a video through the display screen 194. In some embodiments, the modem processor may be an independent device. In some other embodiments, the modem processor may be independent of the processor 110, and the modem processor and the mobile communication module 150 or another functional module may be disposed in the same component.

The wireless communication module 160 may provide a solution for wireless communication including a wireless local area network (wireless local area network, WLAN) (such as a wireless fidelity (wireless fidelity, Wi-Fi) network), Bluetooth (Bluetooth, BT), and a global navigation satellite system (global navigation satellite system, GNSS), frequency modulation (frequency modulation, FM), a near field communication (near field communication, NFC) technology, an infrared (infrared, IR) technology, and the like to be applied to the electronic device 100. The wireless communication module 160 may be one or more devices integrating at least one communication processing module. The wireless communication module 160 receives an electromagnetic wave by using the antenna 2, performs frequency modulation and filtering processing on an electromagnetic wave signal, and sends a processed signal to the processor 110. The wireless communication module 160 may alternatively receive a to-be-sent signal from the processor 110, perform frequency modulation and amplification on the to-be-sent signal, and convert the signal into an electromagnetic wave for radiation by using the antenna 2.

In some embodiments, in the electronic device 100, the antenna 1 is coupled to the mobile communication module 150, and the antenna 2 is coupled to the wireless communication module 160, so that the electronic device 100 can communicate with a network and another device by using a wireless communication technology. The wireless communication technology may include a global system for mobile communications (global system for mobile communications, GSM), a general packet radio service (general packet radio service, GPRS), code division multiple access (code division multiple access, CDMA), wideband code division multiple access (wideband code division multiple access, WCDMA), time-division code division multiple access (time-division code division multiple access, TD-SCDMA), long term evolution (long term evolution, LTE), BT, GNSS, a WLAN, NFC, FM, an IR technology, and/or the like. The GNSS may include a global positioning system (global positioning system, GPS), a global navigation satellite system (global navigation satellite system, GLONASS), and a Beidou navigation satellite system (Beidou navigation satellite system, BDS), a quasi-zenith satellite system (quasi-zenith satellite system. QZSS) and/or a satellite based augmentation system (satellite based augmentation system, SBAS).

The electronic device 100 implements a display function by using the GPU, the display screen 194, the application processor, and the like. The GPU is a microprocessor for image processing, and is connected to the display screen 194 and the application processor. The GPU is configured to perform mathematical and geometric calculation, and is configured to render graphics. The processor 110 may include one or more GPUs, and execute program instructions to generate or change display information.

The display screen 194 is configured to display an image, a video, and the like. The display screen 194 includes a display panel. The display panel may be a liquid crystal display (liquid crystal display, LCD), an organic light-emitting diode (organic light-emitting diode, OLED), an active-matrix organic light-emitting diode (active-matrix organic light-emitting diode, AMOLED), a flex light-emitting diode (flex light-emitting diode, FLED), a mini LED, a micro LED, a micro-OLED, a quantum dot light emitting diode (quantum dot light emitting diode. QLED), or the like. In some embodiments, the electronic device 100 may include one or N display screens 194. N is a positive integer greater than 1.

The electronic device 100 can implement a photographing function by using the ISP, the camera 193, the video codec, the GPU, the display screen 194, the application processor, and the like.

The ISP is configured to process data fed back by the camera 193. For example, during photographing, a shutter is enabled. Light is transferred to a photosensitive element of the camera through a lens, and an optical signal is converted into an electrical signal. The photosensitive element of the camera transfers the electrical signal to the ISP for processing, and therefore, the electrical signal is converted into an image visible to a naked eye. The ISP may also perform algorithm optimization on image noise point, brightness, and skin tone. The ISP may alternatively optimize parameters such as exposure and a color temperature of a photographing scenario. In some embodiments, the ISP may be disposed in the camera 193.

The camera 193 is configured to capture a static image or a video. An optical image of an object is generated through a lens and is projected to the photosensitive element. The photosensitive element may be a charge coupled device (charge coupled device, CCD) or a complementary metal-oxide-semiconductor (complementary metal-oxide-semiconductor, CMOS) phototransistor. The photosensitive element converts an optical signal into an electrical signal, and then transmits the electrical signal to the ISP to convert the electrical signal into a digital image signal. The ISP outputs the digital image signal to the DSP for processing. The DSP converts the digital image signal into a standard image signal in RGB and YUV formats. In some embodiments, the electronic device 100 may include one or N cameras 193, and N is a positive integer greater than 1.

The DSP is configured to process a digital signal, and may further process another digital signal in addition to a digital image signal. For example, when the electronic device 100 performs frequency selection, the DSP is configured to perform Fourier transform and the like on frequency energy.

The video codec is configured to compress or decompress a digital video. The electronic device 100 may support one or more video codecs. In this way, the electronic device 100 may play or record videos in a plurality of encoding formats, for example, moving picture experts group (moving picture experts group, MPEG) 1, MPEG 2, MPEG 3, and MPEG 4.

The NPU is a neural-network (neural-network, NN) computing processor, quickly processes input information by referring to a structure of a biological neural network, for example, a transmission mode between neurons in a human brain, and may further continuously perform self-learning. The NPU may be used to implement an application such as intelligent cognition of the electronic device 100, for example, image recognition, facial recognition, voice recognition, and text understanding.

The external memory interface 120 may be configured to connect to an external storage card, for example, a micro SD card, to expand a storage capability of the electronic device 100. The external storage card communicates with the processor 110 by using the external memory interface 120, so as to implement a data storage function, such as storing a file such as a music or a video in the external storage card.

The internal memory 121 may be configured to store computer executable program code, and the executable program code includes instructions. The internal memory 121 may include a program storage region and a data storage region. The program storage region may store an operating system, an application program required by at least one function (for example, a voice playing function or an image playing function), and the like. The data storage region may store data (for example, audio data and an address book) and the like created w % ben the electronic device 100 is used. In addition, the internal memory 121 may include a high-speed random access memory, or may include a non-volatile memory such as at least one magnetic disk memory, a flash memory, or a universal flash storage (universal flash storage, UFS). The processor 110 runs the instructions stored in the internal memory 121 and/or the instructions stored in the memory disposed in the processor, to implement various functional applications and data processing of the electronic device 100.

The electronic device 100 may implement an audio function by using the audio module 170, the loudspeaker 170A, the phone receiver 170B, the microphone 170C, the headset jack 170D, the application processor, and the like, for example, music playback or recording.

The audio module 170 is configured to convert digital audio information into an analog audio signal output, and is further configured to convert an analog audio input into a digital audio signal. The audio module 170 may be further configured to encode and decode an audio signal. In some embodiments, the audio module 170 may be disposed in the processor 110, or some function modules of the audio module 170 are disposed in the processor 110.

The speaker 170A, also referred to as a "horn", is configured to convert an audio electrical signal into a sound signal. Music can be listened to or a hands-free call can be answered by using the speaker 170A in the electronic device 100.

The phone receiver 170B, also referred to as a "receiver", is configured to convert an audio electrical signal into a sound signal. When the electronic device 100 is configured to answer a call or receive voice information, the phone receiver 170B may be put close to a human ear to receive a voice.

The microphone 170C, also referred to as a "mouthpiece" or a "megaphone", is configured to convert a sound signal into an electrical signal. When making a call or sending voice information, a user may make a sound near the microphone 170C through the mouth of the user, to input a sound signal into the microphone 170C. At least one microphone 170C may be disposed in the electronic device 100. In some other embodiments, two microphones 170C may be disposed in the electronic device 100, to collect a sound signal and implement a noise reduction function. In some other embodiments, three, four, or more microphones 170C may be alternatively disposed in the electronic device 100, to collect a sound signal, implement noise reduction, recognize a sound source, implement a directional recording function, and the like.

The headset jack 170D is configured to connect to a wired headset. The headset jack 170D may be a USB interface 130, or may be a 3.5 mm open mobile terminal platform (open mobile terminal platform, OMTP) standard interface, or a cellular telecommunications industry association of the USA (cellular telecommunications industry association of the USA, CTIA) standard interface.

The pressure sensor 180A is configured to sense a pressure signal, and may convert the pressure signal into an electrical signal. In some embodiments, the pressure sensor 180A may be arranged on the display screen 194. There are a plurality of types of pressure sensors 180A, for example, a resistive pressure sensor, an inductive pressure sensor, and a capacitive pressure sensor. The capacitive pressure sensor may include at least two parallel plates having conductive materials. When force is exerted on the pressure sensor 180A, capacitance between electrodes changes. The electronic device 100 determines strength of pressure based on a change of the capacitance. When a touch operation is performed on the display screen 194, the electronic device 100 detects strength of the touch operation by using the pressure sensor 180A. The electronic device 100 may further calculate a position of the touch based on a detection signal of the pressure sensor 180A. In some embodiments, touch operations that are performed on a same touch position but have different touch operation strength may correspond to different operation instructions. For example, when a touch operation whose touch operation strength is less than a first pressure threshold is performed on an SMS message application icon, an instruction of checking an SMS message is executed. When a touch operation whose touch operation strength is greater than or equal to the first pressure threshold is performed on the SMS message application icon, an instruction of creating a new SMS message is executed.

The gyroscope sensor 180B may be configured to determine a motion posture of the electronic device 100. In some embodiments, an angular velocity of the electronic device 100 around three axes (i.e., x, y, and z axes) may be determined through the gyroscope sensor 180B. The gyroscope sensor 180B may be used for image stabilization during photographing. For example, when the shutter is pressed, the gyroscope sensor 180B detects an angle at which the electronic device 100 jitters, and calculates, based on the angle, a distance for which a lens module needs to compensate, and allows the lens to cancel the jitter of the electronic device 100 through reverse motion, thereby implementing image stabilization. The gyroscope sensor 180B may also be used in navigation and a motion sensing game scene.

The barometric pressure sensor 180C is configured to measure air pressure. In some embodiments, the electronic device 100 calculates an altitude by using the air pressure value measured by the barometric pressure sensor 180C, and assists positioning and navigation.

The magnetic sensor 180D includes a Hall sensor. The electronic device 100 may detect opening and closing of a flip leather sheath by using the magnetic sensor 180D. In some embodiments, when the electronic device 100 is a clamshell phone, the electronic device 100 may detect opening and closing of a flip by using the magnetic sensor 180D. Further, characteristics such as automatic unlocking of the flip are set according to the detected opening and closing state of the leather sheath or the opening and closing state of the flip.

The acceleration sensor 180E may detect acceleration values of the electronic device 10 in all directions (generally in three axes). When the electronic device 100 is stationary, a magnitude and a direction of gravity may be detected. The acceleration sensor may be further configured to recognize a posture of the electronic device, and is applied to an application such as switching between landscape orientation and portrait orientation or a pedometer.

The distance sensor 180F is configured to measure a distance. The electronic device 100 may measure a distance through infrared or laser. In some embodiments, in a photographing scenario, the electronic device 100 may measure a distance by using the distance sensor 180F, to implement quick focusing.

The optical proximity sensor 180G may include, for example, a light-emitting diode (LED) and an optical detector such as a photodiode. The light emitting diode may be an infrared light emitting diode. The electronic device 100 may emit infrared light by using the light-emitting diode. The electronic device 100 detects infrared reflected light from a nearby object by using the photodiode. When detecting sufficient reflected light, the electronic device 100 may determine that there is an object near the electronic device 100. When detecting insufficient reflected light, the electronic device 100 may determine that there is no object near the electronic device 100. The electronic device 100 may detect, by using the optical proximity sensor 180G, that a user holds the electronic device 100 close to an ear for a call, so that automatic screen-off is implemented to achieve power saving. The optical proximity sensor 180G may alternatively be used in a leather case mode or a pocket mode to automatically unlock or lock the screen.

The ambient light sensor 180L is configured to sense luminance of ambient light. The electronic device 100 may adaptively adjust a luminance of the display screen 194 according to perceived brightness of the ambient light. The ambient light sensor 180L may be further configured to automatically adjust white balance during photo taking. The ambient light sensor 180L may further cooperate with the optical proximity sensor 180G to detect whether the electronic device 100 is in a pocket, so as to prevent an accidental touch.

The fingerprint sensor 180H is configured to collect a fingerprint. The electronic device 100 may implement fingerprint unlock, application lock accessing, fingerprint photographing, fingerprint-based call answering, and the like by using a feature of the collected fingerprint.

The temperature sensor 180J is configured to detect a temperature. In some embodiments, the electronic device 100 executes a temperature processing policy by using the temperature detected by the temperature sensor 180J. For example, when the temperature reported by the temperature sensor 180J exceeds a threshold, the electronic device 100 reduces performance of a processor near the temperature sensor 180J, to reduce power consumption and implement heat protection. In some other embodiments, when the temperature is below another threshold, the electronic device 100 heats the battery 142, to prevent the low temperature from causing the electronic device 100 to shut down abnormally. In some other embodiments, when the temperature is below still another threshold, the electronic device 100 boosts an output voltage of the battery 142 to prevent abnormal shutdown caused by the low temperature.

The touch sensor 180K is also referred to as a "touch device". The touch sensor 180K may be disposed on the display screen 194, and the touch sensor 180K and the display screen 194 form a touchscreen. The touch sensor 180K is configured to detect a touch operation performed on or near the touch sensor 180K. The touch sensor may transmit the detected touch operation to the application processor, to determine a touch event type. The touch sensor 180K may provide a visual output related to the touch operation by using the display screen 194. In some other embodiments, the touch sensor 180K may be alternatively disposed on a surface of the electronic device 100, and is located on a position different from that of the display screen 194.

The bone conduction sensor 180M may obtain a vibration signal. In some embodiments, the bone conduction sensor 180M may obtain a vibration signal of a vibration bone of a human vocal-cord part. The bone conduction sensor 180M may alternatively contact a human pulse, and receive a blood pressure beating signal. In some embodiments, the bone conduction sensor 180M may be alternatively disposed in a headset, to form a bone conduction headset. The audio module 170 may obtain a voice signal through parsing based on the vibration signal, of the vibration bone of the vocal-cord part, that is obtained by the bone conduction sensor 180M, to implement a voice function. The application processor may parse heart rate information based on the blood pressure pulse signal obtained by the bone conduction sensor 180M, to implement a heart rate detection function.

The key 190 includes a power key, a volume key, and the like. The key 190 may be a mechanical key, or a touch-type key. The electronic device 100 may receive a key input, and generate a key signal input related to user setting and function control of the electronic device 100.

The motor 191 may generate a vibration prompt. The motor 191 may be configured to provide a vibration prompt for an incoming call, and may be further configured to provide a touch vibration feedback. For example, touch operations performed on different applications (for example, photo taking and audio playing) may correspond to different vibration feedback effects. For touch operations performed on different regions of the display screen 194, the motor 191 may also correspond to different vibration feedback effects. Different application scenarios (for example, a time prompt, information receiving, an alarm clock, and a game) may also correspond to different vibration feedback effects. A touch vibration feedback effect may be further customized.

The indicator 192 may be an indicator light, and may be configured to indicate a charging state or a battery change, or may be further configured to indicate a message, a missed call, a notification, or the like.

The SIM card interface 195 is configured to connect to a SIM card. The SIM card may be inserted into the SIM card interface 195 or plugged from the SIM card interface 195, to come into contact with or be separated from the electronic device 100. The electronic device 100 may support one or N SIM card interfaces. N is a positive integer greater than 1. The SIM card interface 195 can support a nano SIM card, a micro SIM card, a SIM card, and the like. A plurality of cards may all be inserted into the same SIM card interface 195. The plurality of cards may be of the same type or different types. The SIM card interface 195 may further be compatible with different types of SIM cards. The SIM card interface 195 may also be compatible with an external memory card. The electronic device 100 interacts with a network by using a SIM card, to implement functions such as a call and data communication. In some embodiments, the electronic device 100 uses an eSIM, that is, an embedded SIM card. The eSIM card may be embedded in the electronic device 100 and cannot be separated from the electronic device 100.

The technical parameters of the motor 191 in the electronic device 100 are crucial to the establishment of the motor model, and also directly determine the performance of the motor 191. The motor damping is a key parameter among the technical parameters of the motor. Therefore, a solution that can realize the measurement of motor damping is required.

After the motor vibrates under the action of a driving force, a vibration amplitude of the motor gradually decreases due to external factors or its own inherent factors. This factor that causes the vibration amplitude of the motor to gradually decrease may be referred to as damping. The damping of the motor is divided into total damping, mechanical damping, and electromagnetic damping. A sum of the mechanical damping and the electromagnetic damping is equal to the total damping.

Figure 2A:
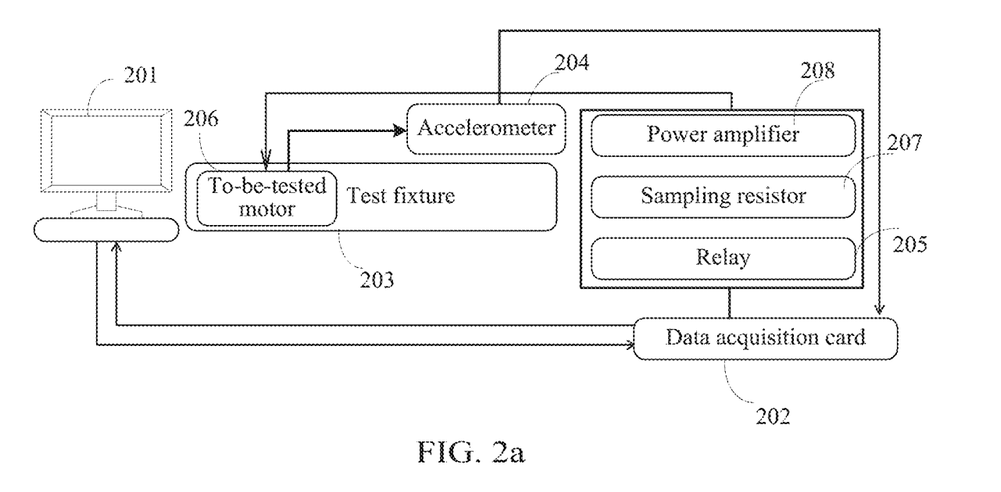
FIG. 2a is a structure diagram of a system for measuring motor damping according to an embodiment of this application.

An embodiment of this application provides a system for measuring motor damping. As shown in FIG. 2*a*, the system for measuring motor damping includes an upper computer 201, a data acquisition card 202, a test fixture 203, an accelerometer 204, and a relay 205. When the damping of the to-be-tested motor 206 is required to be measured, the data acquisition card 202 is connected to the upper computer 201 and the accelerometer 204 respectively. The to-be-tested motor 206 is arranged in the test fixture 203, and the data acquisition card 202 and the accelerometer 204 are respectively connected to the to-be-tested motor 206. The relay 205 is also required to be connected to a branch connecting the data acquisition card 202 to the to-be-tested motor 206.

It should be noted that there are two types of relays: a normally open type and a normally closed type. The normally open type means that the relay is always in an open state by default and will only be closed when an instruction is received. The normally closed type means that the relay is always in a closed state by default and will only be open when an instruction is received. In the embodiment of this application, the relay 205 is a normally closed type.

The data acquisition card 202 and the upper computer 201 can perform signal interaction, and the upper computer 201 can issue instructions to the data acquisition card 202, or may read data from the data acquisition card 202. The data acquisition card 202 is a component that can respond to the instructions of the upper computer, generate control commands to act on other devices, and can automatically collect non-electric quantity signals or electric quantity signals from a detection device or a to-be-tested unit. In this embodiment, under the control of the upper computer 201, the data acquisition card 202 may generate two types of signals: an analog signal and a digital signal. The to-be-tested motor 206 is driven by the analog signal to operate. When the relay 205 is required to be controlled on and off, the data acquisition card 202 generates the digital signal, and the digital signal acts on a control port of the relay 205 to control the opening and closing of the relay 205.

Figure 2B:
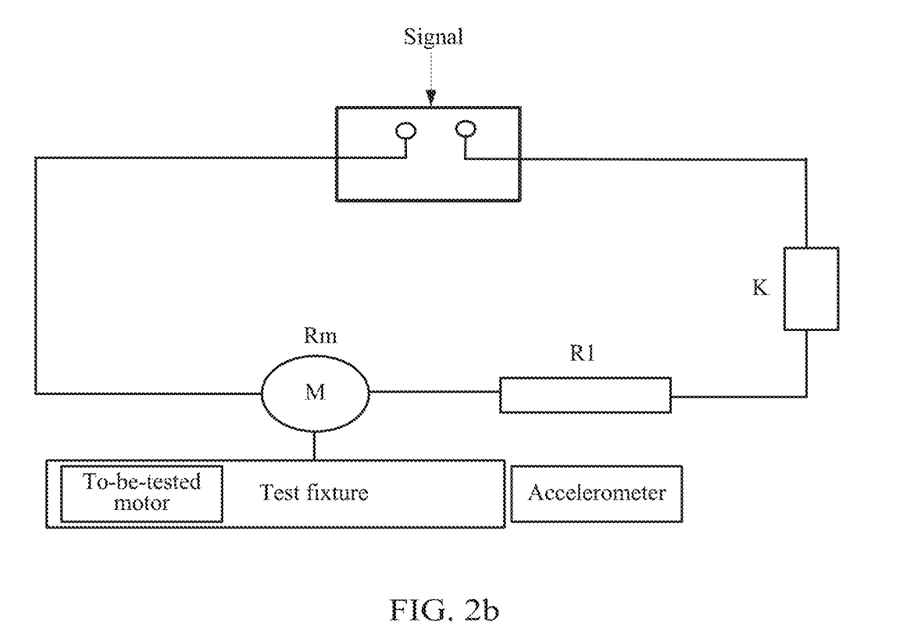
FIG. 2b and FIG. 2c are circuit diagrams of a system for measuring motor damping according to an embodiment of this application.
Figure 2C:
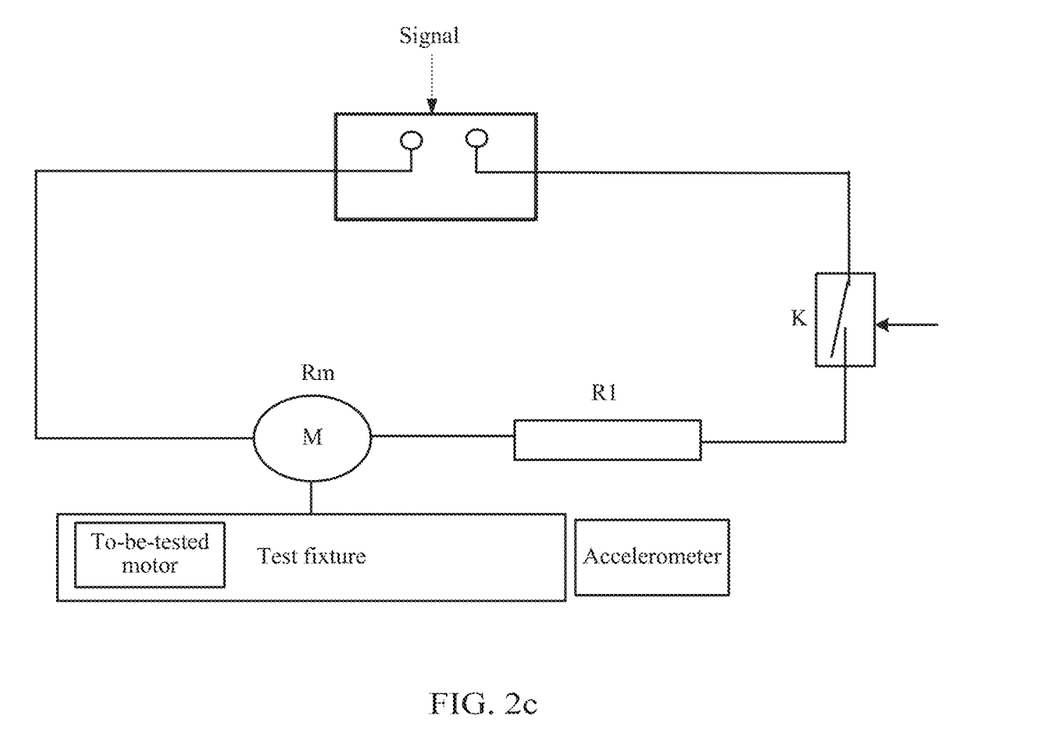

In the circuit diagrams shown in FIG. 2*b* and FIG. 2*c*, the signal may be understood as the analog signal sent by the data acquisition card controlled by the upper computer, which is provided to the to-be-tested motor through a power supply circuit of the to-be-tested motor. M refers to the quality of the test fixture, R1 refers to the sampling resistor, and K refers to the relay. In FIG. 2b, the relay K is in the normally closed state, and the relay K is turned off after receiving the instruction, as shown in FIG. 2c.

During the operation of the to-be-tested motor 206, the accelerometer 204 detects the acceleration of the to-be-tested motor, the data acquisition card 202 may acquire the acceleration of the to-be-tested motor 206 from the accelerometer 204, and the upper computer 201 analyzes and processes the acceleration of the to-be-tested motor 206, and calculates the damping of the to-be-tested motor.

When the total damping of the to-be-tested motor 206 is measured by using the system for measuring motor damping provided in this embodiment, the data acquisition card 202 generates a driving signal, and the to-be-tested motor 206 operates according to the driving signal. At a cut-off moment of the driving signal, the driving signal is no longer inputted to the to-be-tested motor 206, and the to-be-tested motor 206 is in a free damping state. The free damping state is a state in which an amplitude of the motor damps with time after an initial torque is applied and the torque is removed. The acceleration of the to-be-tested motor 206 detected by the accelerometer 204 at this moment may be used for calculating the total damping of the to-be-tested motor 206. Specifically, the data acquisition card 202 acquires the acceleration of the to-be-tested motor in the free damping state, and the acceleration is provided to the upper computer 201. The upper computer 201 calculates the total damping of the to-be-tested motor by using the acceleration of the to-be-tested motor in the free damping state.

Since the sum of the mechanical damping and the electromagnetic damping is the total damping, if the mechanical damping needs to be measured, it is necessary to remove the impact of the electromagnetic damping during operation of the motor. Specifically, the data acquisition card 202 generates a driving signal, and the to-be-tested motor 206 is driven to operate according to the driving signal. The upper computer 201 issues a control instruction at the cut-off moment of the driving signal. The data acquisition card 202 generates a turn-off signal in response to the control instruction, and the relay 205 is controlled by the turn-off signal to be turned off, thereby cutting off the power supply circuit (also referred to as a test circuit) of the to-be-tested motor 206. The power supply circuit of the to-be-tested motor 206 is cut off, and the electromagnetic damping may be eliminated naturally. The accelerometer 204 measures the speed of the to-be-tested motor having the test circuit cut off and in a free damping state, and the obtained acceleration may be used for calculating the mechanical damping of the to-be-tested motor.

Specifically, the data acquisition card 202 acquires the acceleration of the to-be-tested motor having the test circuit cut off and in the free damping state, and the acceleration is provided to the upper computer 201. The upper computer 201 calculates the mechanical damping of the to-be-tested motor by using the acceleration of the to-be-tested motor having the test circuit cut off and in the free damping state.

If the electromagnetic damping of the to-be-tested motor needs to be measured, the mechanical damping may be subtracted from the calculated total damping.

It should be further noted that when the damping of the to-be-tested motor 206 is tested, the to-be-tested motor needs to be mounted in the test fixture 203. Simply put, the test fixture may be a test board having a certain thickness, and the to-be-tested motor 206 is placed on a surface of the test board. A material of the test board is not limited, as long as it can be ensured that the to-be-tested motor 206 will not slide on the surface of the test board during operation. The test fixture 203 may further be a frame-shaped component, and the to-be-tested motor 206 is mounted inside the test fixture, so as to avoid the interference of external factors in the test process. Optionally, a motor mounting area matching a structure of the to-be-tested motor 206 is arranged inside the test fixture 203. In addition, due to different types of to-be-tested motors and different external structures, the motor mounting areas inside the test fixture 203 also need to be diversified to ensure the motor mounting area matching the external structure of each type of to-be-tested motor.

Optionally, a power of the analog signal outputted by the data acquisition card 202 is small. In order to drive the to-be-tested motor, in addition to the relay 205 on the branch connecting the data acquisition card 202 to the to-be-tested motor, a sampling resistor 207 and a power amplifier 208 may further be arranged, which is also shown in FIG. 2a. It should be further noted that the connection positions of the relay 205, the sampling resistor 207, and the power amplifier 208 are adjustable, as long as it is ensured that the three are connected in series. The relay 205, the sampling resistor 207, and the power amplifier 208 may also be integrated as a device.

Optionally, a signal conditioner may further be connected between the accelerometer and the data acquisition card. If the data acquisition card cannot directly analyze a detection signal of the accelerometer, the signal conditioner is required to perform signal conditioning on the detection signal of the accelerometer to obtain a signal that can be analyzed by the data acquisition card. It can be known that the signal demodulator may perform signal conversion, linearization, amplification, and filtering on the detection signal of the accelerometer to obtain a signal that can be analyzed by the data acquisition card.

It should be noted that the work of the upper computer 201 and the data acquisition card 202 shown in FIG. 2a may be summarized as that the upper computer 201 and the data acquisition card 202 cooperate to complete the work. A driving signal is generated to drive a to-be-tested motor to operate. At a cut-off moment of the driving signal, a turn-off signal is generated to cut off a test circuit of the to-be-tested motor. An acceleration of the to-be-tested motor having the test circuit cut off and in a free damping state is acquired, and damping of the to-be-tested motor is calculated by using the acceleration of the to-be-tested motor having the test circuit cut off and in the free damping state.

Optionally, the work may further be completed by cooperation. A driving signal is generated to drive a to-be-tested motor to operate. An acceleration of the to-be-tested motor in a free damping state is acquired, and total damping of the to-be-tested motor is calculated by using the acceleration of the to-be-tested motor in the free damping state.

It should be noted that an integrated device such as a processor may be used to uniformly execute the work content of the upper computer 201 and the data acquisition card 202. Based on this, functions of the processor are as follows.

A driving signal is generated to drive a to-be-tested motor to operate. At a cut-off moment of the driving signal, a turn-off signal is generated to cut off a test circuit of the to-be-tested motor. An acceleration of the to-be-tested motor having the test circuit cut off and in a free damping state is acquired, and mechanical damping of the to-be-tested motor is calculated by using the acceleration of the to-be-tested motor having the test circuit cut off and in the free damping state.

In a possible implementation, the processor may further generate a driving signal to drive a to-be-tested motor to operate, acquire the acceleration of the to-be-tested motor in the free damping state, and calculate the total damping of the to-be-tested motor by using the acceleration of the to-be-tested motor in the free damping state.

In addition, the relay shown in FIG. 2a is not the only device that can turn on and off the test circuit of the to-be-tested motor, and may be replaced with other switches. Certainly, an optronics relay is more commonly used.

Figure 3A:
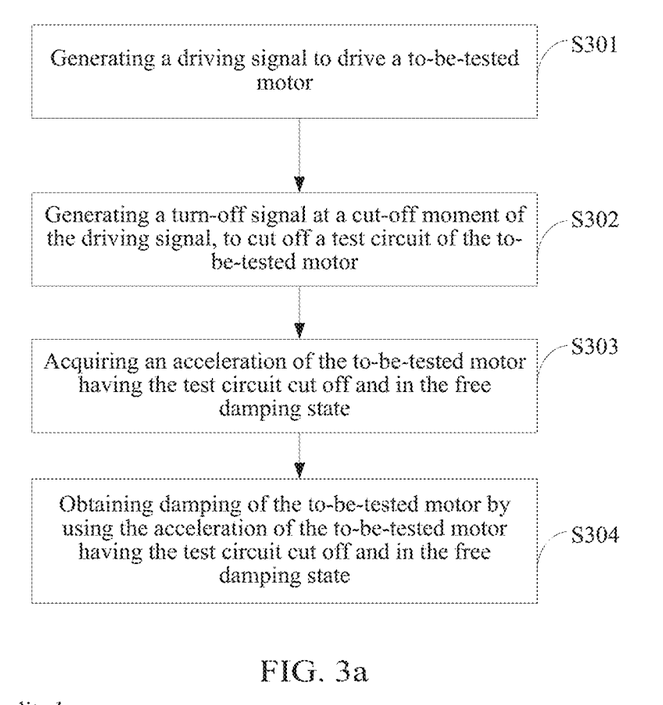
FIG. 3a is a flowchart of a method for measuring motor damping according to an embodiment of this application.

Based on the working process of a processor described in the above embodiment, an embodiment of this application further provides a method for measuring motor damping. As shown in FIG. 3a, the method includes the following steps.

S301: Generating a driving signal to drive a to-be-tested motor.

Damping of the to-be-tested motor is measured according to a test case. The test case includes various test parameters of this test, for example, a duration of the driving signal, and the like. Moreover, if the mechanical damping of the to-be-tested motor is tested, since the electromagnetic damping of the to-be-tested motor needs to be shielded, the test parameters may further include an occurrence moment of the turn-off signal, and the occurrence moment of the turn-off signal should be the same as the cut-off moment of the driving signal.

S302: Generating a turn-off signal at a cut-off moment of the driving signal, to cut off a test circuit of the to-be-tested motor.

Optionally, an implementation of step S202 includes: generating the turn-off signal at the cut-off moment of the driving signal, to drive a switch to be turned off to cut off the test circuit of the to-be-tested motor. The switch is connected to the test circuit of the to-be-tested motor.

The driving signal is generated according to the test case. During the continuous operation of the to-be-tested motor, it is continuously monitored whether the cut-off moment of the driving signal is reached. If the cut-off moment of the driving signal is reached, a turn-off signal is generated.

S303: Acquiring an acceleration of the to-be-tested motor having the test circuit cut off and in the free damping state.

Optionally, an implementation of step S203 includes: acquiring a target acceleration of the to-be-tested motor having the test circuit cut off and in the free damping state, where the target acceleration is obtained by signal conditioning of the acceleration of the to-be-tested motor having the test circuit cut off and in the free damping state.

S304: Obtaining damping of the to-be-tested motor by using the acceleration of the to-be-tested motor having the test circuit cut off and in the free damping state.

An amplitude of a linear motor may be calculated by using the acceleration of the to-be-tested motor having the test circuit cut off and in the free damping state and using the following conversion formula:

$$y_0 = a(0) \div \left[ \frac{w_n^2}{\sqrt{1-\xi^2}} \sin(^3\cos^{-1}\xi) \right]$$

a(0) is the acceleration of the motor, $y_0$ is the amplitude value of the motor, $w_n$ is a free oscillation angular frequency of the motor, and $\xi$ is a damping coefficient.

Figure 3B:
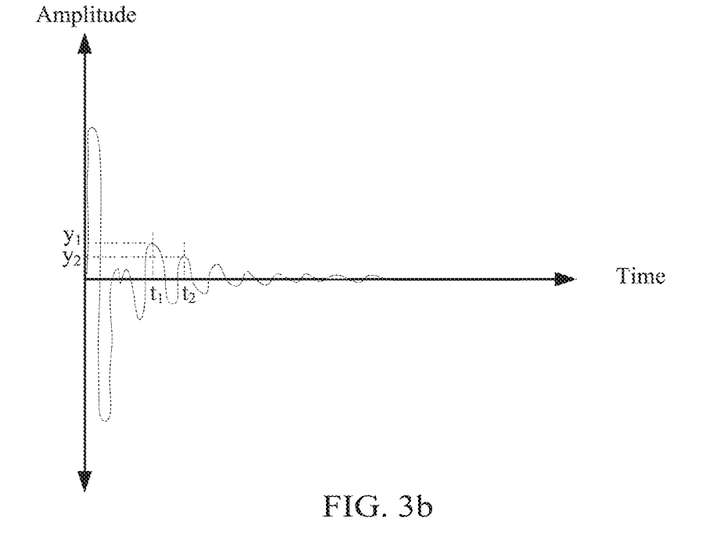
FIG. 3b is a diagram showing a relationship between an amplitude and times of a linear motor according to an embodiment of this application.

Referring to FIG. 3b, the diagram shows the amplitude from a moment when the test circuit of the to-be-tested motor is cut off and the to-be-tested motor is in the free damping state to a moment when the vibration of the to-be-tested motor stops. In the diagram showing a relationship between the amplitude and times of the linear motor in FIG. 3b, two peaks of the amplitude are detected. A speed at which the amplitude of the to-be-tested motor decreases during a time period between $t_1$ and $t_2$ is calculated by using amplitude values $y_1$ and $y_2$ of the two peaks and the occurrence moments $t_1$ and $t_2$ of the two peaks, which may also be referred to as the mechanical damping of the to-be-tested motor. The formula for calculating the mechanical damping of the to-be-tested motor is: $D_j = 20 \times \log(y_1/y_2)/(t_2-t_1)$.

It should be further noted that in this embodiment, the acquired acceleration of the to-be-tested motor in the free damping state may alternatively be the acceleration after signal conditioning.

Figure 4A:
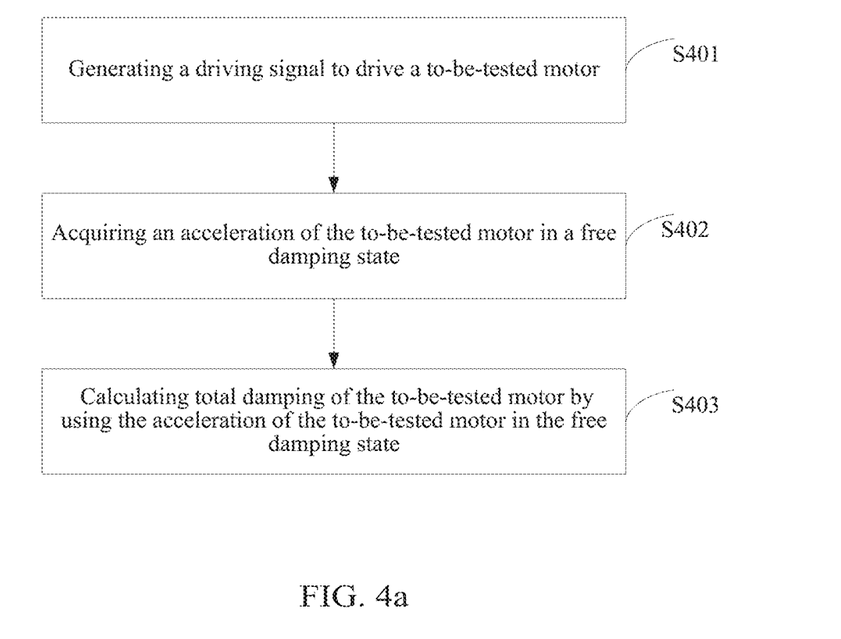
FIG. 4a is a flowchart of a method for measuring motor damping according to an embodiment of this application.

Another embodiment of this application provides a method for measuring motor damping. As shown in FIG. 4a, the method includes the following steps.

S401: Generating a driving signal to drive a to-be-tested motor.

S402: Acquiring an acceleration of the to-be-tested motor in the free damping state.

S403: Calculating total damping of the to-be-tested motor by using the acceleration of the to-be-tested motor in the free damping state.

The total damping of the to-be-tested motor is measured according to the measuring method of this embodiment. The test case includes various parameters used for driving the to-be-tested motor to operate.

The test circuit of the to-be-tested motor is not cut off, and the total damping of the to-be-tested motor may be calculated by using the acceleration of the to-be-tested motor. After the acceleration of the to-be-tested motor in the free damping state is acquired, the amplitude of the linear motor may be obtained by processing the acceleration of the to-be-tested motor in a free damping state through the conversion formula proposed in the above content.

Figure 4B:
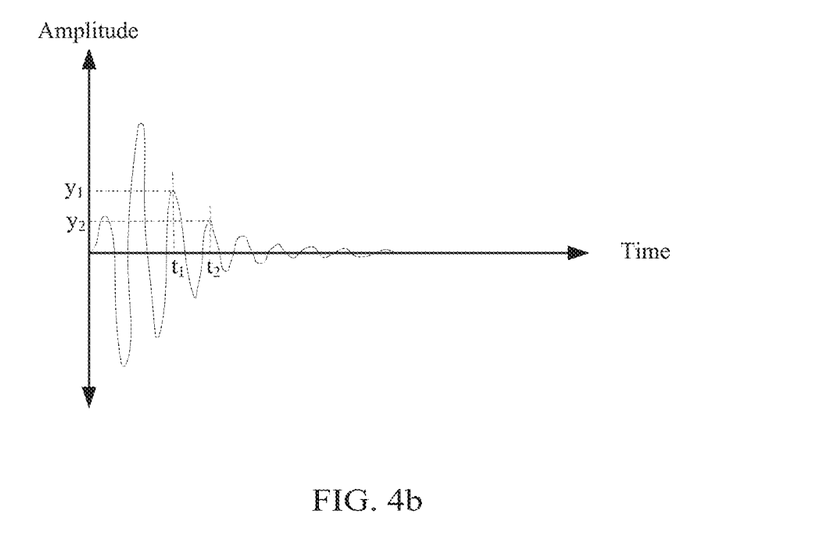
FIG. 4b is a diagram showing a relationship between an amplitude and times of a linear motor according to an embodiment of this application.

Referring to FIG. 4b, the diagram shows the amplitude from a moment when the to-be-tested motor is in the free damping state to a moment when the vibration of the to-be-tested motor stops. In the diagram showing a relationship between the amplitude and times of the linear motor in FIG. 4b, two peaks of the amplitude are detected. The total damping of the to-be-tested motor is calculated by using amplitude values $y_1$ and $y_2$ of two peaks and occurrence moments $t_1$ and $t_2$ of the two peaks and using the following formula: $D_m = 20 \times \log(y_1/y_2)/(t_2-t_1)$.

In this embodiment, the acquired acceleration of the to-be-tested motor in the free damping state may alternatively be the acceleration after signal conditioning.

Figure 5:
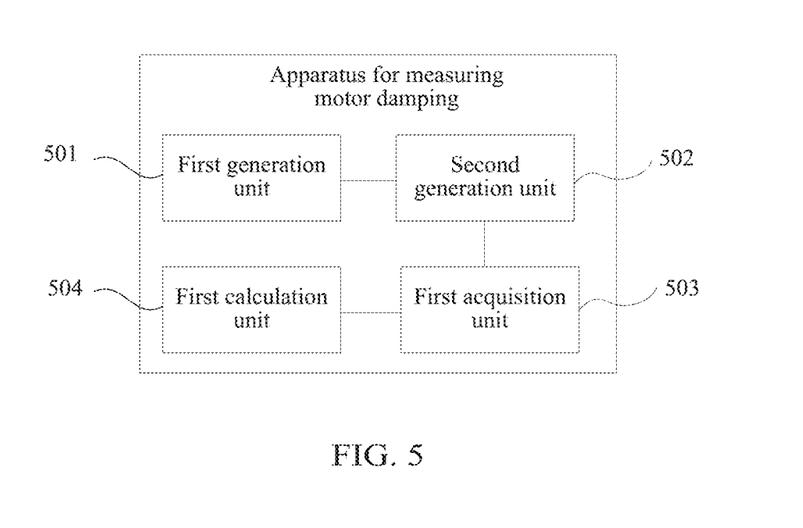
FIG. 5 is a schematic structural diagram of an apparatus for measuring motor damping according to an embodiment of this application.

An embodiment of this application further provides an apparatus for measuring motor damping. As shown in FIG. 5, the apparatus includes:

a first generation unit 501, configured to generate a driving signal to drive a to-be-tested motor: and a second generation unit 502, configured to generate a turn-off signal at a cut-off moment of the driving signal, to cut off a test circuit of the to-be-tested motor.

In a possible implementation, during generation of the turn-off signal at the cut-off moment of the driving signal to cut off the test circuit of the to-be-tested motor, the second generation unit 502 is configured to generate the turn-off signal at the cut-off moment of the driving signal, to drive a switch to be turned off to cut off the test circuit of the to-be-tested motor, where the switch is connected to the test circuit of the to-be-tested motor.

An acquisition unit 503 is configured to acquire an acceleration of the to-be-tested motor having the test circuit cut off and in a free damping state.

In a possible implementation, during acquisition of the acceleration of the to-be-tested motor having the test circuit cut off and in the free damping state, the acquisition unit 503 is configured to acquire a target acceleration of the to-be-tested motor having the test circuit cut off and in the free damping state, where the target acceleration is obtained by signal conditioning of the acceleration of the to-be-tested motor having the test circuit cut off and in the free damping state.

A calculation unit 504 is configured to calculate damping of the to-be-tested motor by using the acceleration of the to-be-tested motor having the test circuit cut off and in the free damping state.

For the specific working process of the unit in the apparatus for measuring motor damping disclosed in the above several embodiments of this application, reference may be made to the content of the corresponding method embodiment.

Figure 6:
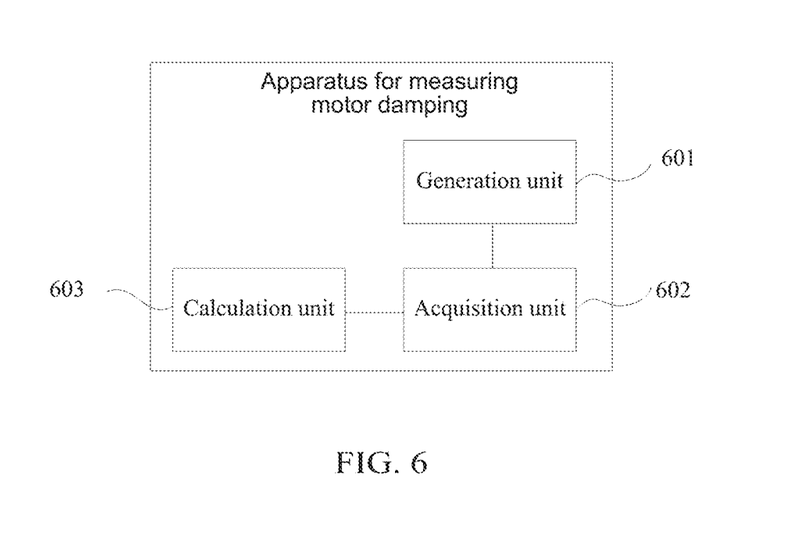
FIG. 6 is a schematic structural diagram of an apparatus for measuring motor damping according to an embodiment of this application.

Another embodiment of this application further provides an apparatus for measuring motor damping. As shown in FIG. 6, the apparatus includes:
a generation unit 601, configured to generate a driving signal to drive a to-be-tested motor;
an acquisition unit 602, configured to acquire an acceleration of the to-be-tested motor in a free damping state; and
a calculation unit 603, configured to calculate total damping of the to-be-tested motor by using the acceleration of the to-be-tested motor in the free damping state.

Optionally, during acquisition of the acceleration of the to-be-tested motor in the free damping state, the acquisition unit 602 is configured to:
acquire a target acceleration of the to-be-tested motor in the free damping state, where the target acceleration is obtained by signal conditioning of the acceleration of the to-be-tested motor in the free damping state.

For the specific working process of the unit in the apparatus for measuring motor damping disclosed in the above several embodiments of this application, reference may be made to the content of the corresponding method embodiment.

Figure 7:
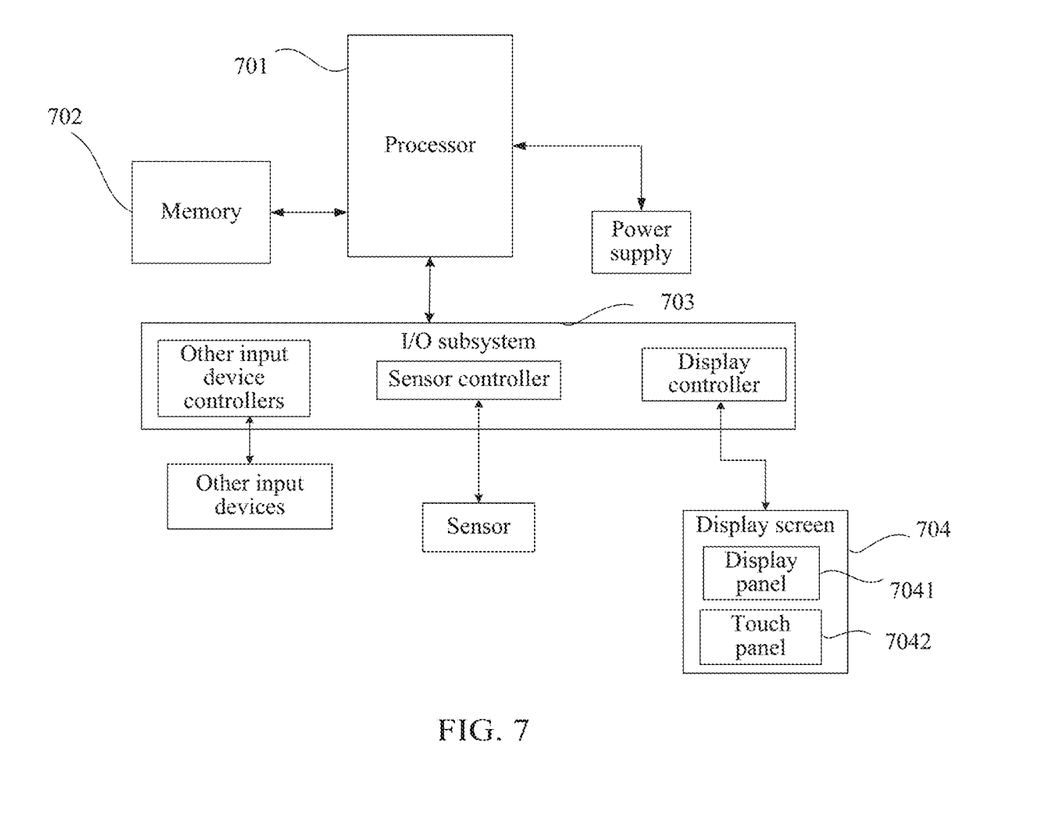
FIG. 7 is a structure diagram of an electronic device performing a measuring method of a to-be-tested motor according to an embodiment of this application.

FIG. 7 shows an electronic device disclosed in an embodiment of this application. The electronic device includes one or more processors 701 and a memory 702 configured to store a program. Optionally, the electronic device may further include an I/O subsystem 703 and a display screen 704.

When one or more processors 701 execute the program in the memory 702, the above method embodiments provide a method for measuring motor damping.

During implementation of the method for measuring motor damping provided in the above method embodiment, the processor in the electronic device provided in this embodiment performs data interaction with the accelerometer in the system for measuring motor damping, so as to complete testing the damping of the to-be-tested motor arranged in the test fixture of the to-be-tested motor.

Optionally, the display screen 704 is connected to the processor 701 by the I/O subsystem 703. The display screen 704 may include a display panel 7041 and a touch screen panel 7042. The display panel 7041 may be configured to display the acceleration of the to-be-tested motor and the calculated damping, and the touch screen panel 7042 may be used for human-computer interaction.

Optionally, the I/O subsystem 703 may specifically include various controllers shown in FIG. 1. The electronic device may further include a power supply, other input devices, and a sensor.

An embodiment of this application shows a readable storage medium. Instructions in the readable storage medium, when executed by a processor of an electronic device, cause the electronic device to perform the method for measuring motor damping in any one of the above embodiments.

Optionally, the readable storage medium may be a non-transitory computer-readable storage medium. For example, the non-transitory computer-readable storage medium may be a ROM, a random access memory (RAM), a CD-ROM, a magnetic tape, a floppy disk, an optical data storage device, and the like.

What is claimed is:

1. A method for measuring motor damping, implemented by a system for measuring motor damping, the system including a processor, the method comprising:
generating a driving signal to drive a to-be-tested motor;
generating, at a cut-off moment of the driving signal, a turn-off signal to cut off a test circuit of the to-be-tested motor, wherein at the cut-off moment of the driving signal, the to-be-tested motor is in a free damping state;
acquiring an acceleration of the to-be-tested motor having the test circuit cut off and in the free damping state; and
obtaining damping of the to-be-tested motor based on the acceleration of the to-be-tested motor having the test circuit cut off and in the free damping state.

2. The method for measuring motor damping of claim 1, wherein generating the turn-off signal at the cut-off moment of the driving signal drives a switch to be turned off to cut off the test circuit of the to-be-tested motor, wherein the switch is connected to the test circuit of the to-be-tested motor.

3. The method for measuring motor damping of claim 1, wherein acquiring the acceleration of the to-be-tested motor having the test circuit cut off and in the free damping state comprises acquiring a target acceleration of the to-be-tested motor having the test circuit cut off and in the free damping state, wherein the target acceleration is obtained by signal conditioning of the acceleration of the to-be-tested motor having the test circuit cut off and in the free damping state.

4. The method for measuring motor damping of claim 1, further comprising:
continuously monitoring whether the cut-off moment of the driving signal is reached; and
generating the turn-off signal responsive to the cut-off moment being reached.

5. A method for measuring motor damping, implemented by a processor, the method comprising:
generating a driving signal to drive a to-be-tested motor, wherein at a cut-off moment of the driving signal, the to-be-tested motor is in a free damping state;
acquiring an acceleration of the to-be-tested motor in the free damping state; and
obtaining total damping of the to-be-tested motor by using based on the acceleration of the to-be-tested motor in the free damping state.

6. The method for measuring motor damping according to claim 5, wherein acquiring the acceleration of the to-be-tested motor in the free damping state comprises acquiring a target acceleration of the to-be-tested motor in the free damping state, wherein the target acceleration is obtained by signal conditioning of the acceleration of the to-be-tested motor in the free damping state.

7. A system for measuring motor damping, comprising:
a processor;
a test fixture configured for a to-be-tested motor to be mounted;
an accelerometer connected to the processor and configured to detect the to-be-tested motor to obtain an acceleration of the to-be-tested motor; and
a switch arranged on a branch connecting the processor to the to-be-tested motor,
wherein the processor is configured to:
generate a driving signal to drive the to-be-tested motor, wherein at a cut-off moment of the driving signal, the to-be-tested motor is in a free damping state;
acquire, from the accelerometer, acceleration data of the to-be-tested motor in the free damping state; and
obtain damping of the to-be-tested motor based on the acceleration data of the to-be-tested motor in the free damping state.

8. The system for measuring motor damping of claim 7, further comprising a sampling resistor and a power amplifier that are arranged on the branch connecting the processor to the to-be-tested motor.

9. The system for measuring motor damping of claim 8, further comprising a motor mounting area matching a structure of the to-be-tested motor arranged inside the test fixture.

10. The system for measuring motor damping of claim 7, further comprising a signal conditioner that is connected to the accelerometer and to the processor, wherein the signal conditioner is configured to:
perform signal conditioning on acceleration data provided by the accelerometer to generate conditioned acceleration data; and
provide the conditioned acceleration data to the processor.

11. The system for measuring motor damping of claim 10, further comprising a motor mounting area matching a structure of the to-be-tested motor arranged inside the test fixture.

12. The system for measuring motor damping of claim 7, wherein the switch is an optronics relay.

13. The system for measuring motor damping of claim 12, further comprising a motor mounting area matching a structure of the to-be-tested motor arranged inside the test fixture.

14. The system for measuring motor damping of claim 7, further comprising a motor mounting area matching a structure of the to-be-tested motor arranged inside the test fixture.

15. The system for measuring motor damping of claim 7, wherein the processor is further configured to generate, at the cut-off moment of the driving signal, a turn-off signal to cut off a test circuit of the to-be-tested motors, and wherein the damping of the to-be-tested motor is based on the acceleration data of the to-be-tested motor having the test circuit cut off and in the free damping state.

16. The system for measuring motor damping of claim 15, wherein when the processor generates the turn-off signal at the cut-off moment, the processor is configured to drive the switch to be turned off to cut off the test circuit of the to-be-tested motor, wherein the switch is connected to the test circuit of the to-be-tested motor.

17. The system for measuring motor damping of claim 15, further comprising a signal conditioner that is connected to the accelerometer and to the processor, wherein the signal conditioner is configured to:
perform signal conditioning on acceleration data provided by the accelerometer to generate conditioned acceleration data; and
provide the conditioned acceleration data to the processor,
wherein the processor is further configured to acquire a target acceleration of the to-be-tested motor having the test circuit cut off and in the free damping state, wherein the target acceleration is based on the conditioned acceleration data.

18. The system for measuring motor damping of claim 15, wherein the processor is further configured to:
continuously monitor whether the cut-off moment of the driving signal is reached; and
generate the turn-off signal responsive to the cut-off moment being reached.

19. The system for measuring motor damping of claim 7, wherein the damping is a total damping of the to-be-tested motor.

20. The system for measuring motor damping of claim 19, further comprising a signal conditioner that is connected to the accelerometer and to the processor, wherein the signal conditioner is configured to:
perform signal conditioning on acceleration data provided by the accelerometer to generate conditioned acceleration data; and
provide the conditioned acceleration data to the processor,
wherein the processor is further configured to acquire a target acceleration of the to-be-tested motor in the free damping state, wherein the target acceleration is based on the conditioned acceleration data.

* * * * *

UNITED STATES PATENT AND TRADEMARK OFFICE
CERTIFICATE OF CORRECTION

| | | |
|---|---|---|
| PATENT NO. | : 12,098,978 B2 | Page 1 of 1 |
| APPLICATION NO. | : 17/799382 | |
| DATED | : September 24, 2024 | |
| INVENTOR(S) | : Jianwei Zhu | |

It is certified that error appears in the above-identified patent and that said Letters Patent is hereby corrected as shown below:

In the Claims

Claim 5, Column 20, Lines 58-59: "motor by using based on" should read "motor based on"

Signed and Sealed this
Twenty-sixth Day of November, 2024

Katherine Kelly Vidal
*Director of the United States Patent and Trademark Office*